United States Patent [19]

Brown et al.

[11] 4,316,920
[45] Feb. 23, 1982

[54] THICK FILM RESISTOR CIRCUITS

[75] Inventors: John F. Brown, Emmaus; Robert M. Stanton, Allentown, both of Pa.

[73] Assignee: Bell Telephone Laboratories, Incorporated, Murray Hill, N.J.

[21] Appl. No.: 165,551

[22] Filed: Jul. 3, 1980

[51] Int. Cl.³ .................... H05K 3/12; H01C 17/06; H01C 17/30

[52] U.S. Cl. ................... 427/96; 427/101; 427/102; 427/103; 427/376.3; 427/380; 427/383.5

[58] Field of Search ............ 427/96, 101-103, 427/383.5, 376.3, 380

[56] References Cited

U.S. PATENT DOCUMENTS

| 2,993,815 | 7/1961 | Treptow | 427/96 |
|---|---|---|---|
| 3,914,514 | 10/1975 | Mackenzie | 427/383.5 |
| 4,039,721 | 8/1977 | Weitze | 427/383.5 |
| 4,072,771 | 2/1978 | Grier, Sr. | 427/96 |
| 4,140,817 | 2/1979 | Brown | 427/96 |
| 4,191,789 | 3/1980 | Brown | 427/97 |

FOREIGN PATENT DOCUMENTS 1374763 11/1974 United Kingdom ............ 427/96

OTHER PUBLICATIONS

Loasby et al., "Enhanced Property Thick-Film Conductor Pastes", Solid State Technology, pp. 46-57, May 1972.

Katz, "Adhesion of Copper Films to Aluminum Oxide Using a Spinel Structure Interface", Thin Solid Films, 33, pp. 99-105 (1976).

Primary Examiner—John D. Smith
Attorney, Agent, or Firm—Lester H. Birnbaum

[57] ABSTRACT

A method of forming thick film resistor circuits whereby non-noble metals (11, 12) requiring a reducing firing atmosphere are included with resistor material (13) requiring an oxidizing atmosphere. The conductor metallization is capable of adhering to the substrate at a low firing temperature in air. The resistors are printed and fired in air after conductor formation. The metal oxide can then be reduced at a sufficiently low temperature so as not to significantly affect the resistor material. In one embodiment, the conductor paste includes copper and glass frits which can adhere to a ceramic substrate by firing at a temperature of less than 1100 degrees C.

10 Claims, 1 Drawing Figure

U.S. Patent
Feb. 23, 1982
4,316,920
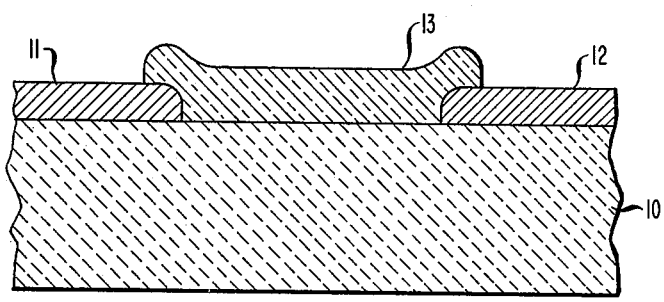

THICK FILM RESISTOR CIRCUITS

BACKGROUND OF THE INVENTION

This invention relates to thick film circuits and in particular to the fabrication of such circuits which include a non-noble metal conductor for interconnection of the circuit elements.

Most thick film circuits presently employ a conductor system which is based on the noble metals silver, gold, palladium and platinum, alone or in combination, and a resistor material including a ruthenium-based composition. Although such circuits perform satisfactorily, several problems are involved in the use of precious metal pastes. A major problem is the rising cost of such precious metals, which has a significant impact on the economies of thick film circuit fabrication. In addition, silver in the paste tends to migrate across the substrate surface and/or through dielectrics to cause short circuits. Furthermore, conductor pastes including silver, gold or palladium can cause poor solderability of the circuit.

To solve such problems, those skilled in the art have sought alternatives to the noble metal pastes. One such alternative involves use of a copper-based conductor. Copper thick film pastes which include glass frits are commercially available, but they are normally fired in a nitrogen atmosphere which is incompatible with ruthenium-based resistor material (see, e.g., U.S. Pat. No. 4,072,771, issued to Grier, Sr.). Copper pastes without glass frits generally require a high temperature firing in an oxidizing atmosphere followed by a high temperature firing in a reducing atmosphere which causes severe degradation of resistor materials requiring an oxidizing atmosphere.

A recent proposal provided a technique for making a fritless copper paste conductor requiring a reducing atmosphere compatible with a resistor material requiring an oxidizing atmosphere (see, U.S. Pat. No. 4,140,817, issued to Brown). In that process, after an initial firing in air, the conductor material was subject to a high temperature reduction followed by a re-oxidation to produce a copper oxide having a lower density than the oxide formed after the initial firing. The resistor material was then deposited and fired in an oxidizing atmosphere, and the low density copper oxide was reduced at a low temperature so resistor properties were not affected. While the process presented a viable solution to the problem, it suffered from the disadvantages of requiring a high initial firing temperature in a special furnace, as well as extra processing steps.

It is therefore a primary object of the invention to provide a method for fabricating a thick film circuit including non-noble metal conductors whereby the formation of the conductors is compatible with the formation of resistors requiring an oxidizing atmosphere. It is a further object of the invention to provide such a method with a minimum of processing steps and low firing temperatures.

SUMMARY OF THE INVENTION

These and other objects are achieved in accordance with the invention which is a method for fabricating a thick film resistor circuit including non-noble metal conductors on a substrate. The process includes depositing a paste including the metal on the substrate, and heating the structure in an oxidizing ambient at a temperature sufficient to establish adhesion between the paste and substrate. Resistor material is then formed on the substrate and on portions of the conductors, followed by heating the structure in an oxidizing ambient to establish a desired resistivity of the resistor material. The structure is then heated in a reducing atmosphere to establish a desired resistivity for the conductors. The conductor paste includes glass frits so that adhesion is achieved at a low temperature and the material resulting from the initial heating can be reduced at a sufficiently low temperature so as not to significantly affect the resistor material.

BRIEF DESCRIPTION OF THE DRAWING

These and other features of the invention are delineated in detail in the following description together with the FIGURE which is a cross-sectional view of a portion of a thick film circuit fabricated in accordance with one embodiment of the invention.

DETAILED DESCRIPTION

Fabrication of the circuit was on a substrate, 10, which was composed of approximately 96 percent $Al_2O_3$. The invention can be practiced with any insulating substrate on which a thick film circuit is normally formed.

In accordance with a key feature of the invention, a non-noble metal paste was prepared which would adhere to the substrate by a firing in air at a low temperature. In this particular example, the paste consisted essentially of metal or metal oxide, an organic vehicle comprising a binder and at least one solvent, and a glass frit to promote adhesion. Specifically, the metal was copper in the form of a powder having particle sizes of 1–3 microns which was sold by Metz Metallurgical Corporation. The organic vehicle comprised ethyl cellulose as a binder and butyl carbitol acetate and alpha terpineol as solvents.

An important feature of the paste is the fact that the glass frit is chosen so that the paste can be fired in air and at a low temperature (preferably less than 1100 degrees C.). The frit should also provide a suitable match of thermal expansion coefficient with the substrate. In this particular example, the glass frit was a material including $K_2O$, $Na_2O$, $MgO$, $ZnO$, $Li_2O$, $Al_2O_3$, $B_2O_3$ and $SiO_2$ which is sold by the O. Hommel Company under the designation PF-497. It will be understood that other non-noble metals, organic vehicles and glass frit can be used as long as adhesion of the paste can be achieved by firing in air at low temperatures in accordance with the invention.

A 100 gm batch of the paste was prepared by loading approximately 55 gms of the copper powder into a ball mill with approximately 5 gms of the glass frit and solvents for wetting the copper and preventing caking or agglomeration. The mixture was milled for approximately 18 hours to reduce the size of the glass frit and mix the solids. The mixture was filtered and dried at 100 degrees C. for 5 min. Meanwhile, a 10 percent solution of the organic vehicle was prepared by mixing approximately 10 gms of the binder and 45 gms each of the solvents. The binder preferably comprises 3–20 percent of the vehicle and either of the two solvents can be varied from 0–100 percent of the solvent for the vehicle. The dried copper powder plus glass frit was mixed with the organic vehicle to form a thick film paste. In this example the paste was approximately 75 percent by weight of the copper and frit and approximately 25 percent by weight of the vehicle. A useful range for the solids (metal and frit) would appear to be 40-90 percent of the paste. The proportion of the solids constituting the glass frit is preferably in the range 3-20 percent. (For a more detailed discussion of the preparation of such a paste for use in filling via holes, see, U.S. Pat. No. 4,191,789, issued to the present inventors and assigned to the same assignee as the present application.)

The conductor paste was screen printed onto the substrate in accordance with standard techniques to produce a conductor pattern, including conductor elements 11 and 12. The particular screen was a 200 mesh screen with a 0.2 mil emulsion pattern. The thickness of the screened-on paste after drying was approximately 0.9 mil, although thicknesses in the range 0.3 to 3 mil may be used. The paste was dried by heating at 125 degrees C. for approximately 10 minutes.

In order to effect adhesion between the metallization and substrate, the structure was fired in air. (It will be appreciated that during the firing in air, the organic vehicle and solvents will be evaporated. The term "metallization " is used in this application to designate the components remaining after firing, namely, the metal and the glass frit.) One of the important advantages of the invention is the fact that adequate adhesion can be achieved at relatively low temperatures. In this particular example, firing was done at a peak temperature of 1000 degrees C. for a period of approximately 10 min. Total heating time was approximately 60 min wherein the temperature was first increased at a rate of 35 deg/min and then decreased at a rate of 45 deg/min. Heating took place in a standard belt furnace. In order to insure that the material can later be reduced at a low temperature, a recommended maximum firing temperature is 1100 degrees C. For non-noble pastes in general, a useful minimum would be approximately 600 degrees C., while for this particular paste a temperature of at least 950 degrees C. is desirable. Firing times at peak temperatures should preferably fall within the range 1 to 30 minutes.

A resistor paste was then screen printed onto selected portions of the substrate and conductor members to define resistors such as 13. A 200 mesh screen was utilized with a 0.2 mil thick emulsion pattern. The thickness of the resistors after drying ranged from 0.5-1.0 mils. The particular material used was a resistor ink comprising a bismuth ruthenate and a lead boro-silicate glass sold by DuPont under the designation "Birox." The invention should be useful with any resistor material which is fired in an oxidizing atmosphere, and appears most beneficial for use with any ruthenium-based resistor material.

The resistor paste was dried by heating the structure to a temperature of 125 degrees C. for 10 minutes. Next, the desired resistivity for the resistors was achieved by firing the structure in air. In this particular example, firing was done at approximately 850 degrees C. for 10 minutes to achieve a sheet resistance of approximately 1000 ohms per square. The temperature had been increased at a rate of 35 deg/min and following the peak temperature was decreased at a rate of 45 deg/min. The total cycle time was approximately 60 min. This was the firing cycle recommended by the manufacturer to achieve the designated resistivity. It will therefore be appreciated that the firing temperature and times will vary according to the particular resistor material and resistivity desired.

The proper conductivity of the conductor elements, 11 and 12, was then obtained by heating the structure in a reducing atmosphere. Due to the low initial firing temperature of the conductor paste, the resulting metal oxide was sufficiently low in density to permit reduction at a temperature which was sufficiently low so as not to significantly affect resistor properties. Further, the frit does not contain easily reducible components such as lead and therefore remains stable during this reduction step. In this example, the reduction took place in an atmosphere of 10 percent $H_2$ and 90 percent $N_2$ at a temperature of 300 degrees C. for 30 minutes. Total heating time was approximately 60 min wherein the temperature rose at a rate of 20 deg/min and decreased at a rate of 20 deg/min. The final sheet resistance of the conductors was no greater than 0.01 ohms per square. Any reducing atmosphere could be used. For these particular conductor and resistor pastes, a useful heating range appears to be 250-400 degrees C. for 15-60 minutes.

Circuits fabricated in accordance with the present method consistently resulted in desirably low sheet resistance for the conductors (no greater than 0.01 ohms per square) while the resistivity of resistors remained within required tolerance. For example, as a result of the reducing step in accordance with this embodiment, the resistor values changed by no more than 0.5 percent. Thus, processing of the conductors had no significant adverse effect on resistors and vice-versa.

Although a particular conductor paste has been described in the above emboidment, it will be appreciated that the invention is not so limited. Thus, the copper metal could be replaced by copper-oxide or other low cost non-noble metals which require a reducing atmosphere and exhibit properties similar to copper as a result of oxidation and reduction reactions. Such metals include nickel, cobalt, titanium, chromium, cadmium and vanadium. Other compositions of glass frits may be utilized as long as they are not easily reducible and will provide adhesion when firing in an oxidizing atmosphere at temperatures of 1100 degrees C. or less. Other organic vehicles may be utilized as long as they provide the proper characteristics for the paste consistent with efficient pattern generation. For example, it is known that the vehicle should be thixotropic, have a viscosity within a range for good screen printing, and be removable during firing at a sufficiently low temperature and rate to avoid cracks and voids.

Various additional modifications will become apparent to those skilled in the art. All such variations which basically rely on the teachings through which the invention had advanced the art are properly considered within the spirit and scope of the invention.

We claim:

1. A method for fabricating a thick film resistor circuit including copper conductors (11, 12) on a substrate (10) comprising the steps of depositing a paste including the copper on the substrate, heating the structure at a temperature sufficient to establish adhesion between the metallization and substrate, forming a resistor material (13) on said substrate and portions of the conductors, heating the resulting structure in an oxidizing atmosphere to establish a desired resistivity for the resistor material, and heating the structure in a reducing atmosphere to establish a desired resistivity for the conductor, characterized in that the conductor paste includes glass frits so that adhesion is acheived by heating in an oxidizing atmosphere at a temperature in the range 600–1100 degrees C. and the metal oxide resulting from the initial heating is reduced at a temperature in the range 250–400 degrees C. so as not to significantly affect the resistor material.

2. The method according to claim 1 wherein adhesion is achieved by heating in air for 1–30 min.

3. The method according to claim 1 wherein the desired resistivity for the conductors is achieved by heating for 15–60 min.

4. The method according to claim 1 wherein the desired sheet resistance for the conductors is no greater than 0.01 ohms per square.

5. The method according to claim 1 wherein the paste further comprises an organic vehicle comprising a binder and at least one solvent.

6. The method according to claim 1 wherein the resistor material comprises ruthenium-based components.

7. The method according to claim 1 wherein the substrate comprises alumina.

8. The method according to claim 1 wherein the reducing atmosphere comprises a mixture of $H_2$ and $N_2$.

9. A method for fabricating a thick film resistor circuit including copper conductors (11, 12) on a substrate (10) comprising the steps of depositing a paste including copper on the substrate, heating the structure at a temperature sufficient to establish adhesion between the metallization and substrate, forming a resistor material (13) comprising ruthenium-based components on said substrate and portions of the conductors, heating the resulting structure in an oxidizing atmosphere to establish a desired resistivity for the resistor material, and heating the structure in a reducing atmosphere to establish a sheet resistance of less than 0.01 ohms per square for the conductor, characterized in that the conductor paste includes glass frits so that adhesion is achieved by heating in an oxidizing atmosphere at a temperature of 950–1100 degrees C. and the copper oxide resulting from this heating is reduced at a temperature of 250–400 degrees C. so as not to significantly affect the resistor material.

10. The method according to claim 1 or 9 wherein the glass frit comprises $K_2O$, $Na_2O$, $MgO$, $ZnO$, $Li_2O$, $Al_2O_3$, $B_2O_3$, and $SiO_2$.

* * * * *